United States Patent
Li et al.

(10) Patent No.: US 10,985,763 B2
(45) Date of Patent: Apr. 20, 2021

(54) SQUARE WAVE-TO-SINE WAVE CONVERTER

(71) Applicant: TEXAS INSTRUMENTS INCORPORATED, Dallas, TX (US)

(72) Inventors: Qunying Li, Allen, TX (US); Shanmuganand Chellamuthu, Richardson, TX (US); Kemal Safak Demirci, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/991,072

(22) Filed: Aug. 12, 2020

(65) Prior Publication Data

US 2020/0373926 A1  Nov. 26, 2020

Related U.S. Application Data

(63) Continuation of application No. 16/391,865, filed on Apr. 23, 2019, now Pat. No. 10,784,873.

(51) Int. Cl.
| | |
|---|---|
| *H03L 7/081* | (2006.01) |
| *H03K 3/0233* | (2006.01) |
| *H03K 6/02* | (2006.01) |
| *H02M 7/46* | (2006.01) |
| *H03H 7/01* | (2006.01) |
| *H03F 3/45* | (2006.01) |
| *H03G 3/30* | (2006.01) |

(52) U.S. Cl.
CPC ............ *H03L 7/0812* (2013.01); *H02M 7/46* (2013.01); *H03F 3/45071* (2013.01); *H03G 3/30* (2013.01); *H03H 7/0161* (2013.01); *H03K 3/0233* (2013.01); *H03K 6/02* (2013.01)

(58) Field of Classification Search
CPC .................................................... H03H 7/0161
USPC .................................................. 327/129, 553
See application file for complete search history.

(56) References Cited

U.S. PATENT DOCUMENTS

2011/0279175 A1*  11/2011  Kuo ....................... H03H 11/12
                                                                      327/553

OTHER PUBLICATIONS

Stitt, R., "Simple Filter Turns Square Waves into Sine Waves", Burr-Brown, 1993 (Year: 1993).*
Webster, J., "Programmable Filters", Wiley Encyclopedia of Electrical and Electronics Engineering, 1999 (Year: 1999).*
Stitt, R., "Simple Filter Turns Square Waves into Sine Waves," burr-Brown, 1993 (Year: 1993), 3 pages.
Webster., J., "Programmable Filters," Wiley Encyclopedia of Electrical and Electronics Engineering, 1999 (Year: 1999), 21 pages.

* cited by examiner

*Primary Examiner* — Tomi Skibinski
(74) *Attorney, Agent, or Firm* — Ray A. King; Charles A. Brill; Frank D. Cimino

(57) ABSTRACT

A circuit includes a bandpass filter and a self-tracking circuit. The bandpass filter has a first input node configured to receive an input square wave signal and an output node configured to provide an output sine wave signal. The bandpass filter includes a first binary-weighted programmable resistor array. The self-tracking circuit includes a second input node coupled to the output node. The self-tracking circuit includes a counter, and the counter includes an output node coupled to the first binary weighted programmable resistor array.

5 Claims, 6 Drawing Sheets

SQUARE WAVE-TO-SINE WAVE CONVERTER

CROSS REFERENCE TO RELATED APPLICATION(S)

This continuation application claims priority to U.S. patent application Ser. No. 16/391,865, filed Apr. 23, 2019, which application is incorporated herein by reference in its entirety.

BACKGROUND

A resolver sensor is usable to determine the rotational speed of a motor. A resolver sensor includes an excitation coil that is driven with a sinusoidal voltage, To generate the sinusoidal voltage, a sensor interface circuit receives a square wave dock signal, and converts the square-wave dock signal to a sinusoidal signal.

SUMMARY

In one example, a circuit includes a bandpass filter and a self-tracking circuit. The bandpass filter has a first input node configured to receive an input square wave signal and an output node configured to provide an output sine wave signal. The bandpass filter includes a first binary-weighted programmable resistor array. The self-tracking circuit includes a second input node coupled to the output node. The self-tracking circuit includes a counter, and the counter includes an output node coupled to the first binary weighted programmable resistor array.

BRIEF DESCRIPTION OF THE DRAWINGS

For a detailed description of various examples, reference will now be made to the accompanying drawings in which.

DETAILED DESCRIPTION

In accordance with the described examples, a square wave-to-sine wave converter circuit include a bandpass filter. The center frequency of the bandpass filter is tuned to the fundamental frequency of the input square-wave signal. If the center frequency of the bandpass filter is tuned correctly, the output signal from the bandpass filter comprises a sine-wave of the same frequency as the input square-wave and will have relatively low total harmonic distortion.

Bandpass filters can be implemented with, among other components, resistors and capacitors. The center frequency of the bandpass filter is inversely proportional to the product of a resistance and a capacitance. Unfortunately, the resistance of a resistor and the capacitance of a capacitor can vary with respect to process, age, and temperature. Changing values of resistance and/or capacitance, therefore, will change the center frequency of the bandpass filter, thereby increasing total harmonic distortion and causing a decrease in the amplitude of the output sine-wave from the filter.

In one example, one or more resistors of the bandpass filter are provided external to the semiconductor substrate (die) containing the remaining electrical components of the filter. The use of an external resistor permits a user to perform a final calibration of the bandpass filter, thereby calibrating around process variations. During the calibration process, a suitable value of the resistor is determined, and a resistor with that particular value is, for example, attached to a printed circuit board containing the die having the rest of the components of the bandpass filter. The resolver sensor and the printed circuit board then may be installed in a larger system, such as an electric automobile to measure the speed of the automobile's electric motor. This type of trim calibration, however, is a one-time calibration and is inadequate if the component values of the resistor and/or capacitors change with age.

The disclosed examples are directed to a bandpass filter that includes internal (i.e., on the same semiconductor die as the rest of the components of the bandpass filter) programmable resistors. In one example, each programmable resistor comprises a binary-weighted programmable resistor array. A control word can be determined to ensure the output sine-wave from the filter has the same fundamental frequency as the input square-wave. The control word is provided to switches within the binary-weighted programmable resistor array to cause the resistor array to implement a particular resistance value to cause the filter to have the desired center frequency.

Figure 1:
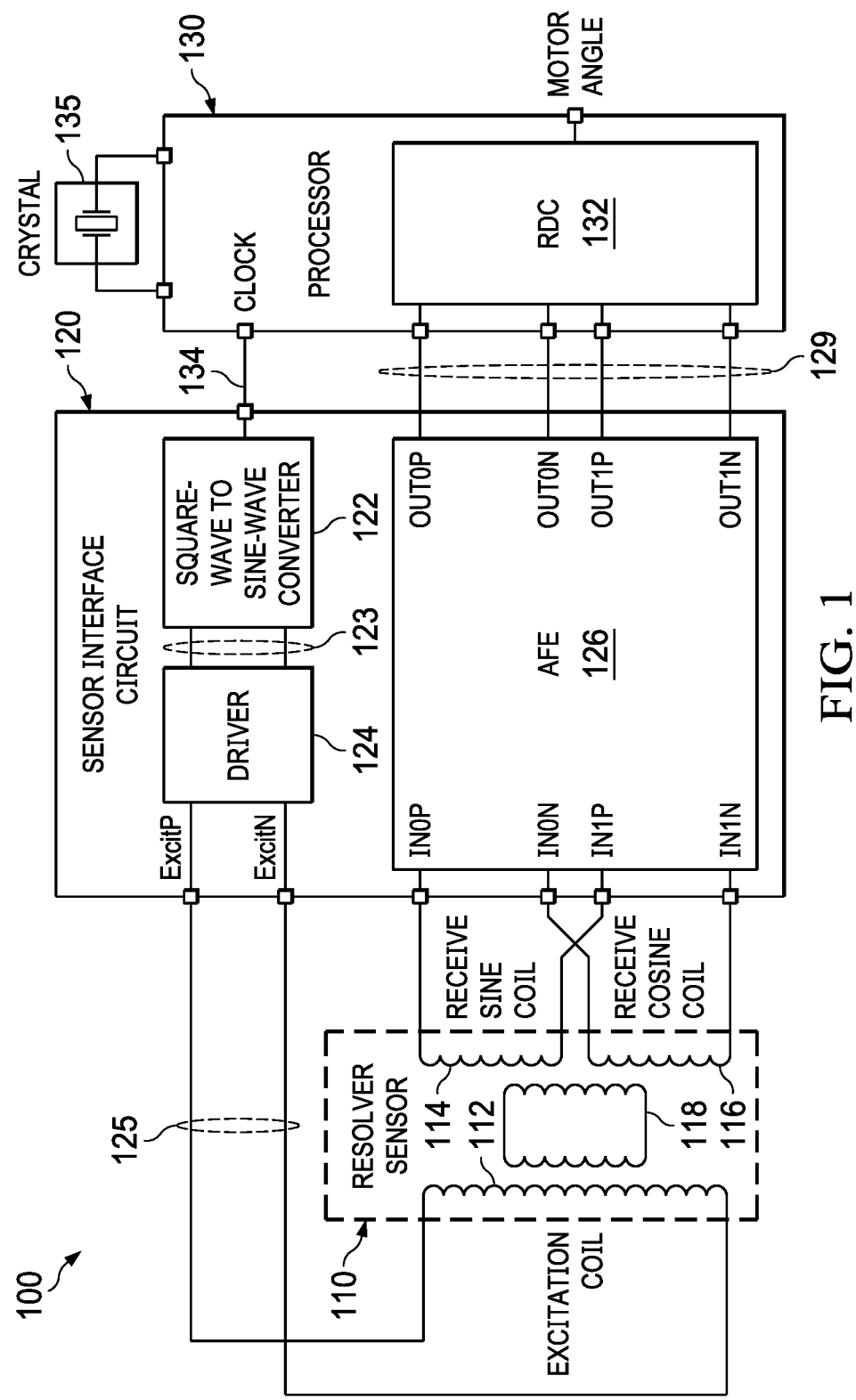
FIG. 1 illustrates a system including a resolver sensor and a square wave-to-sine wave converter to produce a sine wave for exciting an excitation coil within the resolver sensor.

FIG. 1 shows an example of a system 100 comprising a resolver sensor 110, a sensor interface circuit 120, a processor 130, and a crystal oscillator 135. The resolver sensor includes four conductive coils 112, 114, 116, and 118 in this example. Coil 112 is an excitation coil (and is referred to herein as the excitation coil 112) and includes two terminals coupled to positive and negative excitation terminals (ExcitP and ExcitN) of the sensor interface circuit. Coils 112, 114 and 116 are mounted on the stator of the motor. Coil 118 is mounted on, or is coupled to, the rotor of the motor shaft, and thus rotates at the speed of the motor itself. Coils 114 and 116 are mounted 90 degrees apart from each other. The sensor interface circuit 120 provides a sine-wave voltage 125 to the excitation coil 112. Via electromagnetic induction, energy is coupled from the excitation coil 112 to the rotating coil 118, and then from the rotating coil to the orthogonally positioned coils 114 and 116.

During each cycle of rotation of the rotating coil 118, the angle between the plane defined by the rotating coil 118 varies sinusoidally with respect to the planes defined by each of coils 114 and 116. The output signal from each of coils 114 and 116 itself varies sinusoidally, and the magnitude of the output signal each from each of coil 114 and 116 also varies sinusoidally at a frequency corresponding to the speed of the rotating coil 118 (which is the same as the rotational speed of the motor). However, as the coils 114 and 116 are positioned on the stator orthogonal to one another (e.g., the planes defined by the coils are at a 90 degree with respect to each other), the envelope of the output signal from receive sine coil 114 is phase shifted from the output signal of receive cosine coil 116 by 90 degrees. As such, coil 114 is referred to as the receive sine coil 114, and coil 114 is referred to as the cosine receive coil 116.

Figure 2:
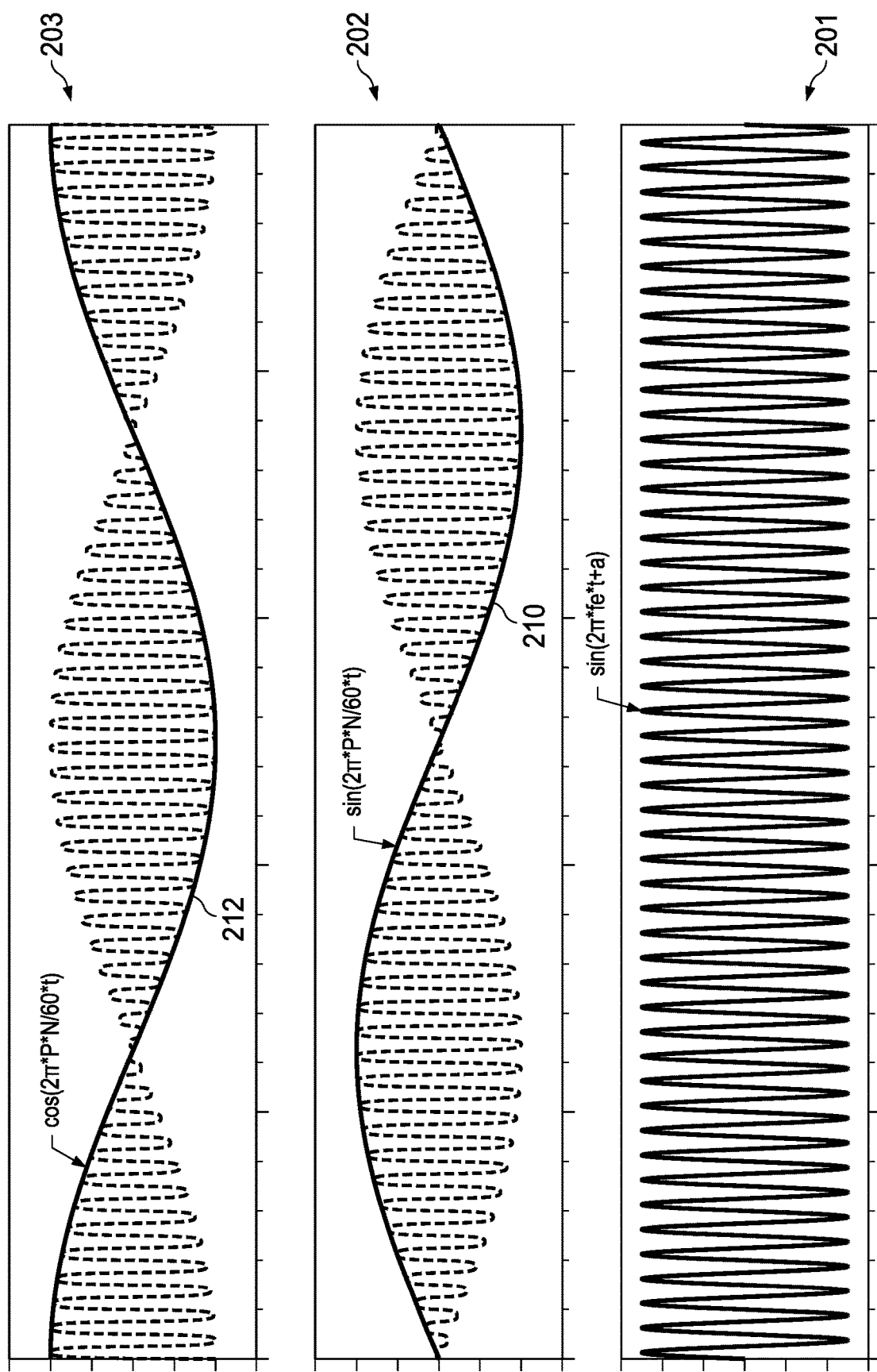
FIG. 2 illustrates waveforms pertaining to coils within the resolver sensor.

FIG. 2 shows example waveforms 201, 202, and 203. Waveform 201 is the sine-wave voltage 125 provided to the excitation coil 112. Waveform 201 has a frequency of fc, and the amplitude of waveform 201 is constant. Waveform 202 is the voltage across the terminals of the receive sine coil 114, and waveform 203 is the voltage across the terminals of the receive cosine coil 116. As can be seen in FIG. 2, the envelopes 210 and 212 of waveforms 202 and 203 are sinusoidal in nature, but phase shifted with respect to each other by 90 degrees. The frequency of envelopes 210 and 220 are given as P*t*N/60, where P is the number of motor poles, t is time, and N is the rotational speed of the motor (in units of revolutions per minute). Thus, the faster the motor spins, the higher will be the frequency of envelopes 210 and 212, and the slower the motor spins, the lower will be the frequency of envelopes 210 and 212.

Referring again to FIG. 1, the processor 130 includes a resolver-to-digital converter (RDC) 132, which in one example comprises a hardware circuit within the processor 130 to process the signals from the receive sine and cosine coils 114, 116 to calculate the instantaneous motor angle. As the motor turns, the motor angle itself changes as well, and from the changing motor angle over time, motor speed can be calculated (either by processor 130 or a different processor).

The crystal oscillator 135 provides a clock signal to the processor 130, and the processor 130 produces a clock signal 134 to the sensor interface circuit 120 at a frequency suitable for driving the excitation coil 112 of the resolver sensor 110. The efficiency of the resolver sensor 110 varies with the frequency of the excitation sine-wave to the excitation coil 112, and thus the processor produces the clock 134 to have the desired frequency.

The sensor interface 120 includes a square wave-to-sine wave converter 122, a driver 124, and an analog front end (AFE) 126. The square wave-to-sine wave converter 122 receives the clock signal 134 from the processor 130. As the clock signal 134 comprises a square-wave signal, clock signal 134 is referred to herein as "square-wave" 134. The square wave-to-sine wave converter 122 converts square-wave 134 to a sine-wave 123, for example, a sine-wave having the same fundamental frequency as the square-wave 134. The sine-wave 123 is then provided to driver 124 which generates the sine-wave voltage 125 for the excitation coil 112 at the same frequency as the sine-wave 123 and at a current level suitable for the excitation coil.

The signals from the receive sine and cosine coils 114 and 116 are provided to the AFE 126. The AFE 126 includes differential amplifiers to amplify the signals from the receive sine and cosine coils 114 and 116. The resulting amplified analog signals 129 are provided to inputs of the RDC 132 within the processor 130. The RDC 132 digitizes the signals, and uses the digitized signals to determine the motor angle. The motor angle can be determined by RDC 132 as the arctangent of the ratio of the signal from the receive cosine coil 116 to the signal from the receive sine coil 114 ($\tan^{-1}$ (sine/cos).

Figure 3:
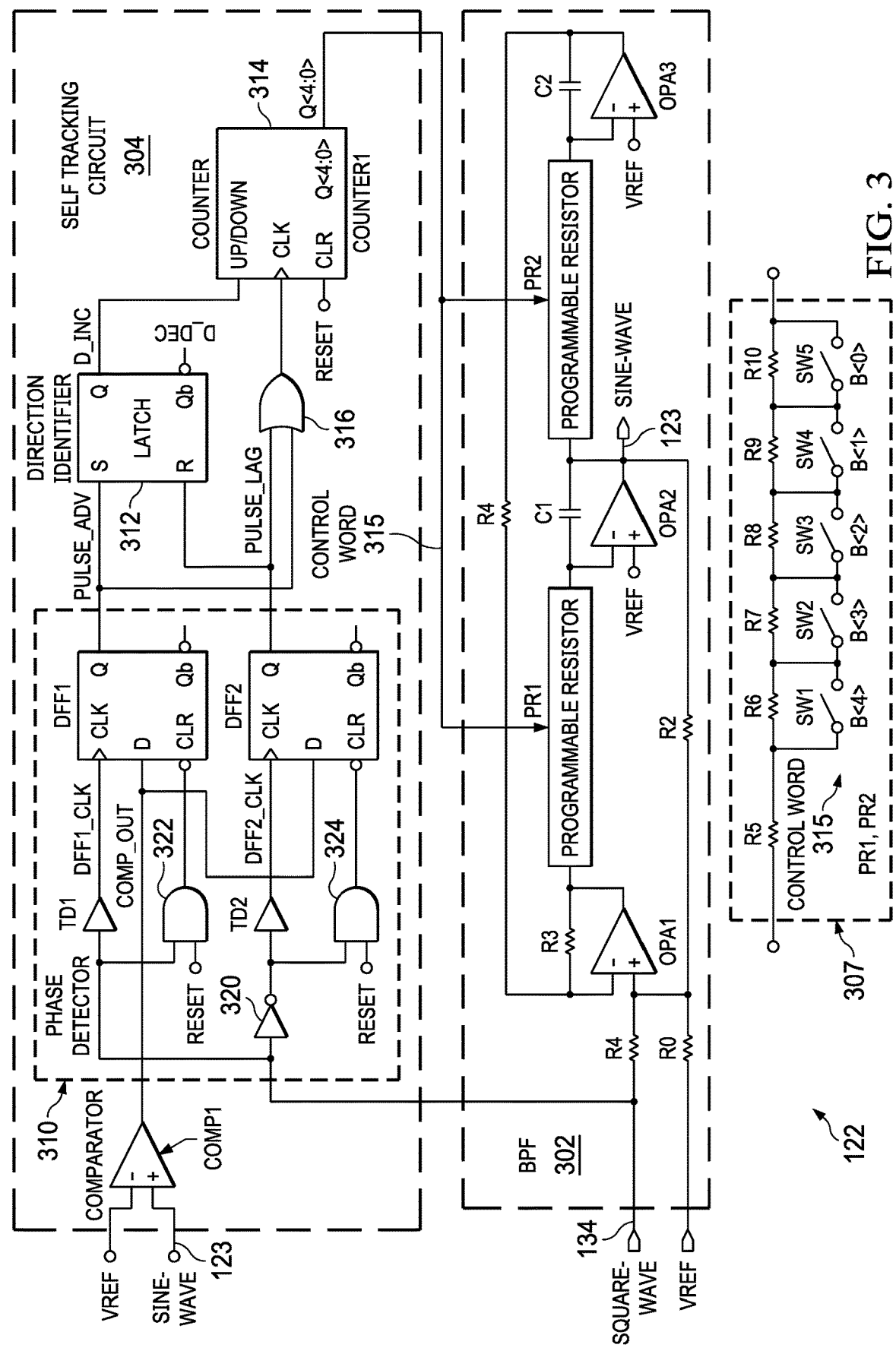
FIG. 3 shows an example implementation of the square wave-to-sine wave converter of FIG. 1.

FIG. 3 shows an example implementation of square wave-to-sine wave converter 122. The example square wave-to-sine wave converter 122 includes a bandpass filter 302 coupled to a self-tracking circuit 304. The self-tracking circuit 304 includes a comparator COMP1, a phase detector 310, latch 312, counter 314, and an OR gate 316. The bandpass filter 302 includes operational amplifiers OPA1, OPA2, and OPA3, resistors R0, R1, R2, R3, and R4, capacitors C1 and C2, and programmable resistors PR1 and PR2. In one implementation, the components of the bandpass filter 302 including PR1 and PR2 as well as COMP1, phase detector 310, latch 312, counter 314, and OR gate 316 are provided on the same semiconductor die. That is, PR1 and PR2 are not provided external to the die containing the remaining components of the bandpass filter 302.

Operational amplifier OPA1 receives the input square-wave 134 through R1 to its non-inverting input, sums the feedback voltage from the second stage output (sine-wave 123) through R2, and subtracts the feedback from the output of OPA3 through R4. R3 is coupled between the inverting input and the output of OPA1. C1 is coupled between the inverting input and the output of OPA2, and C2 is coupled between the inverting input and the output of OPA3. A reference voltage, VREF, is provided to the non-inverting input of OPA1 through R0, and VREF is provided the non-inverting inputs of OPA2 and OPA3. PR1 is coupled between R3 and C1, and PR2 is coupled between C1 and C2.

The output of OPA2 provides the final output sine-wave 123 from the bandpass filter 302. OPA2 in concert with C2 and the programmable resistance of PR1 low-pass filters the output from OPA1. OPA3 in concert with the C3 and the programmable resistance of PR2 low-pass filters the output of OPA2 (i.e., the sine-wave 123). For the low-pass filtering performed by OPA3, the low frequency portion (below the cut-off frequency of the low pass filter comprising OPA3) is fed back through R4 and subtracted at OPA1, thereby equivalent to a high-pass filtering function. Thus, the combination effect of the OPA1 stage (summing), OPA2 stage (low-pass filter), and OPA3 third stage (low-pass filter but equivalent to high-pass because it is subtracted by OPA1) performs a band-pass filtering function to converting the input square-wave 134 to an output sine-wave 123.

In this example, PR1 and PR2 are implemented as binary-weighted programmable resistor arrays as shown at 307. Each binary-weighed programmable resistor array comprises a set of binary-weighted resistors R5, R6, R7, R8, R9, and R10, with R5 being, for example, a unit resistance (R), R6 having a resistance twice that of the unit resistance (i.e., 2R), R7 having a resistance four times that of the unit resistance (i.e., 4R), R8 having a resistance eight times that of the unit resistance (i.e., 8R), R9 having a resistance 16 times that of the unit resistance (i.e., 16R), and R10 having a resistance 32 times that of the unit resistance (i.e., 32R). A switch (e.g., a transistor) is coupled in parallel across R6-R10. Switch S1 is coupled across R6. Switch S2 is coupled across R7. Switch S3 is coupled across R8. Switch S4 is coupled across R9. Switch S5 is coupled across R10. By opening and closing switches SW1-SW5, any integer resistance value from R to 63R can be implemented by PR1 or PR2. A separate bit B is used to control each switch. B<0> controls the open/close state S5. B<1> controls the open/close state S4. B<2> controls the open/close state S3. B<3> controls the open/close state S2. B<4> controls the open/close state S1. The collection of bits B<4:0> forms a control word 315 generated by the self-tracking circuit 304. In this example, PR1 is configured using the same control word as is used to configure PR2. Thus, the programmed resistances of PR1 and PR2 are the same.

As explained above, the center frequency of a bandpass filter is inversely related to a product of a resistance and a capacitance. In this case, the center frequency of bandpass filter 302 is $1/(2\pi*PR1*C1)$, where PR1 in this expression represents the programmed resistance of PR1. The self-tracking circuit 304 detects if the frequency of the sine-wave 123 starts to deviate from the frequency of the square-wave 134, and adjusts the control word 315 (bits B<4:0>) to cause the frequency of the sine-wave 123 to again match that of the square-wave 134.

COMP1 of the self-tracking circuit 304 comprises a comparator that implements hysteresis and compares the sine-wave 123 to VREF. VREF is the common-mode voltage level of the sine-wave 123. VREF may be set at one-half of the supply voltage of the comparator. The output of COMP1 is shown as COMP_OUT. The phase detector 310 includes D flip-flops DFF1 and DFF2, time delay elements TD1 and TD2, inverter 320, and AND gate 324. Each D flip-flop includes a data (D) input, a clock (CLK) input, a clear (CLR) input, and a Q output. The input square-wave 134 is coupled to the inputs of TD1 and inverter 320. The output of inverter 320 is coupled to the input of TD2. The output of TD1 is coupled the CLK input of DFF1, and the output of TD2 is coupled to the CLK input of DFF2. The COMP_OUT signal from COMP1 is coupled to the D input of each of DFF1 and DFF2. The inputs of AND gate 322 are coupled to the output of COMP1 and to a reset signal, and the output of AND gate 322 is coupled to the CLR input of DFF1. The inputs of AND gate 324 are coupled to the output of inverter 320 and to the reset signal, and the output of AND gate 324 is coupled to the CLR input of DFF2.

Latch 312, in this example, comprises an SR latch having an S input and an R input. The Q output of DFF1 provides a signal called Pulse_Adv, and the Q output of DFF1 is coupled to the S input. The Q output of DFF2 provides a signal called Pulse_Lag, and the Q output of DFF2 is coupled to the R input.

In this example, counter 314 comprises an up/down counter. The UP/DOWN input to counter 314 is coupled to the Q output of latch 312. The signal generated by the Q output of latch 312 is designated as D_INC and is used to control the count direction (up or down) of counter 314. D_INC being a logic 1 causes counter 314 to count up, and D_INC being a logic 0 causes counter 314 to count down. The counter's output is the control word 315 used to dynamically configure PR1 and PR2. The control word 315 comprises a multi-bit binary value that is incremented or decremented (depending on the logic state of D_INC) upon the occurrence of clock edge on the CLK input of the counter. OR gate 316 has inputs coupled to the Q outputs of DFF1 and DFF2, and logically ORs together Pulse_Adv and Pulse_Lag to generate a clock edge of the counter 314. In one example, the counter's output control word 315 is incremented or decremented upon a rising edge of the signal on the counter's CLK input.

Figure 4:
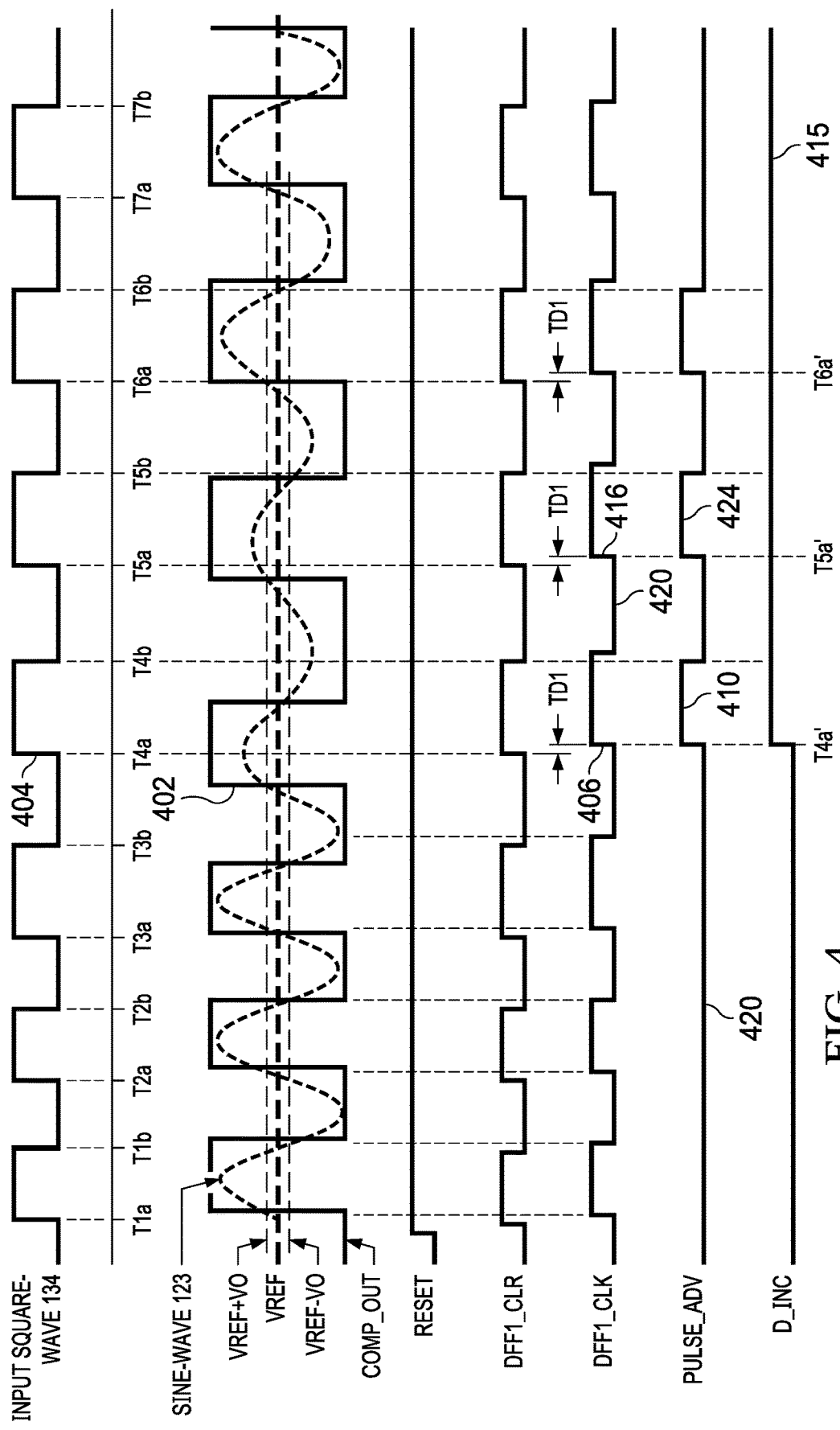
FIG. 4 is a timing diagram illustrating the operation of the square wave-to-sine wave converter when the output sine wave is in phase lead with respect to the input square wave.

FIG. 4 is an example timing diagram illustrating various signals within FIG. 3. By comparing the sine-wave 123 to VREF, COMP1 effectively digitizes the sine-wave 123 to produce COMP_OUT. The rising and falling edges of COMP_OUT are slightly delayed from the zero-crossing points of sine-wave 123 to the hysteresis voltage (v0) implemented by COMP1. The reset signal also is shown logic low initially, and then a logic high. The reset signal is a global reset that remains high during normal operation of the sensor interface circuit 120. As the reset signal is high during normal operation, the output signal AND gate 322 is logic high when COMP_OUT is high, and logic low when COMP_OUT is low. Similarly, the output signal from AND gate 324 is logic high when the output signal from inverter 320 is logic high, and logic low when the output signal from inverter 320 is logic low. TD1 and TD2 introduce a time delay, which is the same amount of time delay between the time delay elements. TD1 delays the rising and falling edges of the input square wave 134, and TD2 delays the rising and falling edge from the inverter 134 (which is the inverted form of the input square wave 134). A rising edge of the input square wave 134 (after a time delay via TD1) clocks DFF1. Due to inverter 320, a falling edge of the input square wave 134 (after a time delay via TD2) clocks DFF2. Further, a rising edge of the input square wave 134 clocks DFF1 and, via inverter 320 AND gate 324, a logic high input square wave 134 clears DFF2. Similarly, a falling edge of the input square wave 134 clocks DFF2 and, via AND gate 322, a logic low input square wave 134 clears DFF1. Thus, when DFF1 is clocked, DFF2 is cleared, and when DFF2 is clocked, DFF1 is cleared.

The self-tracking circuit 304 operates to ensure that COMP_OUT (digital version of the output sine-wave 123) is in phase-lock with respect to the input square-wave 134. The phase detector 310 detects whether the COMP_OUT signal lags or leads the input square wave, and adjusts the control word 315 to reduce the detected phase lag or lead. During phase-lock, each rising edge of COMP_OUT should occur slightly after a corresponding rising edge of the input square-wave 134, and each falling edge of COMP_OUT should occur slightly after a corresponding falling edge of the input square-wave 134. The timing diagram of FIG. 4 illustrates an example of COMP_OUT leading the input square-wave 134. At T1a, T2a, and T3a, the rising edge of COMP_OUT occurs slightly after the rising edges of the input square-wave 134. However, starting at T4a, rising edge 402 of COMP_OUT leads corresponding rising edge 404 of the input square-wave 134 (phase lead). That COMP_OUT leads the input square-wave 134 may be caused by, for example, a change in the frequency of the input square-wave.

DFF1 is clocked with each rising edge of the input square (after the delay introduced by TD1). The clock signal input to the DFF1 is shown in FIG. 4 (DFF1_CLK) and is shown to have a slight delay relative to the input square-wave 134. At T1a, T2a, and T3a, COMP_OUT is logic low when the rising edge of DFF_CLK occurs. In response, the Pulse_Adv output from DFF1 is logic low as shown at 410. As explained above, when DFF1 is clocked, DFF2 is cleared and thus DFF2's Pulse_Lag output signal also is logic low (not shown in FIG. 4). Thus, the output from OR gate 316 remains low and the counter is not clocked with a rising edge. This is the desired behavior as the phase of the output sine-wave 123 is not leading the phase of the input square-wave 134 at T1a, T2a, and T3a.

However, it is possible that the phase of the output sine-wave 123 is lagging the phase of the input square-wave 134. Phase lag is determined using the falling edges of the input square-wave 134. As explained above, the falling edges of the input square-wave 134 (after TD2 delay) clocks DFF2. The low level of the input square-wave clears DFF1 causing Pulse_Adv to remain logic low (or transition to logic low if Pulse_Adv had previously been logic high). At T1b, T2b, and T3b, COMP_OUT is logic low when the falling edge of DFF1_CLK occurs (which equates to a rising edge of the CLK input to DFF2). Thus, at T1b, T2b, and T3b, DFF2 clocks in a 0 on its D input and Pulse_Lag is logic low. Thus, from T1a-T3b, no phase lead nor phase lag is detected by DFF1 and DFF2 and the control word need be, and is not, adjusted.

At T4a, when rising edge 406 of DFF1_CLK occurs, COMP_OUT is already a logic 1, and DFF1 asserts Pulse_Adv to a logic 1 level as shown at 410. The logic 1 Pulse_Adv cause the D_INC output from latch 312 to also be asserted to a logic 1 level as illustrated at 415. D_INC being a logic 1 causes the counter 314 to count upon the next occurrence of a rising edge on its CLK input from OR gate 316. Pulse_Adv becoming a logic 1 (and D_INC being a logic 1 as well) thereby causes the counter 314 to increment its control word 315. When DFF1_CLK is then logic low at 420, DFF1 is cleared and Pulse_Adv becomes a 0. Upon the next rising edge 416 of DFF1, the process repeats and another Pulse_Adv pulse 424 occurs again causing the counter 314 to increment its control word 315.

Each time the control word 315 increments, PR1 and PR2 are configured to implement a different (larger in the example of COMP_OUT phase leading the input square-wave 134) resistance within the bandpass filter 302. A larger resistance causes a reduction in the center frequency of the bandpass filter. The adjustment to the bandpass filter 302 continues until phase-lock is again achieved, which is detected at T7a. At that point, the phase detector 310 ceases generating Pulse_Adv pulses and the counter 314 thus ceases being clocked. D_INC previously asserted high by latch 312 remains high, but the counter 314 does not receive any more rising edges on its CLK input.

Figure 5:
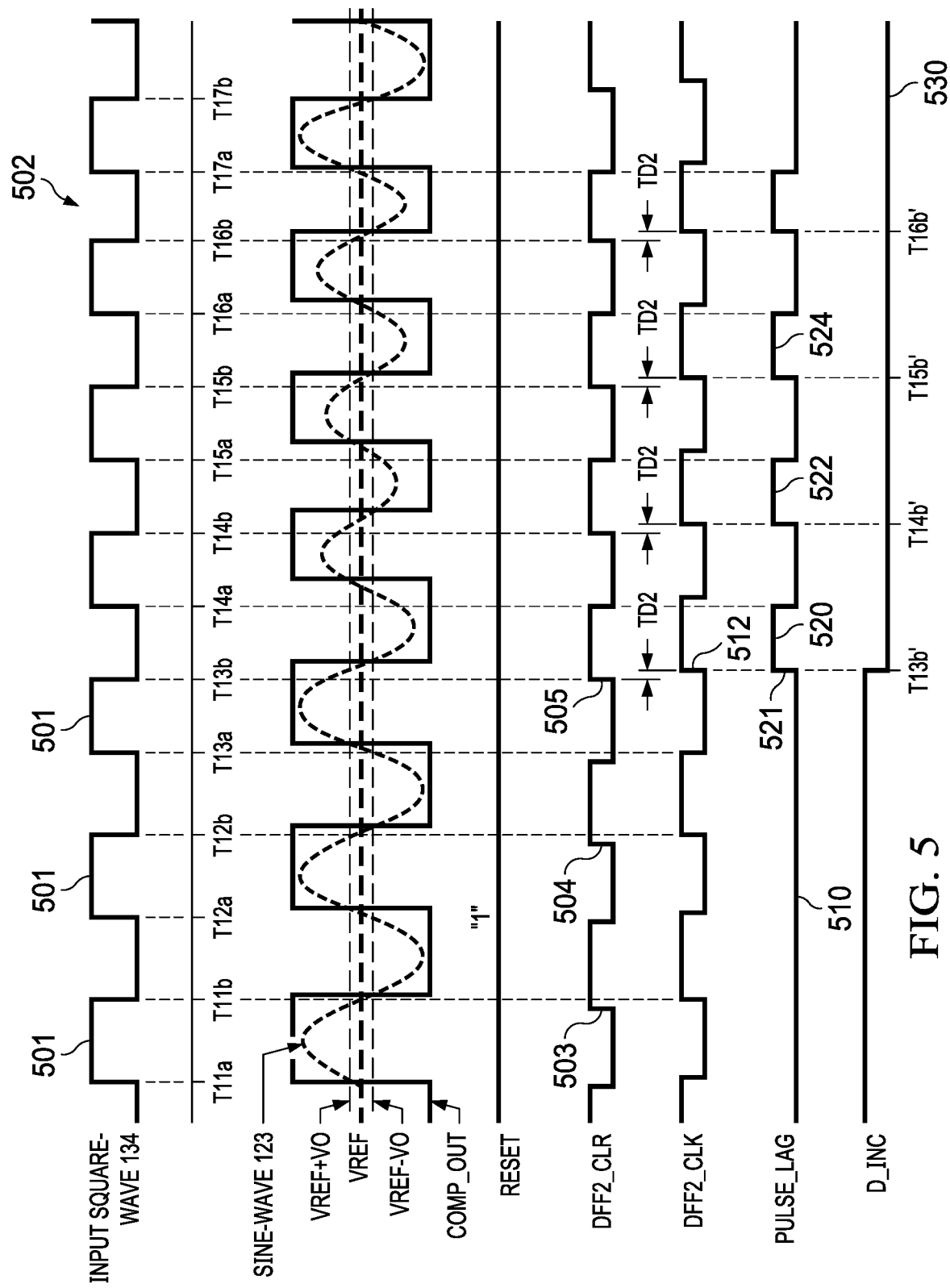
FIG. 5 is a timing diagram illustrating the operation of the square wave-to-sine wave converter when the output sine wave is in phase lag with respect to the input square wave.

FIG. 5 is a timing diagram illustrating phase-lock for the first three cycles 501 shown of the input square-wave 134, and then a phase lag starting at with the fourth cycle 502. The flip-flop input clock in FIG. 5 is the input clock for DFF2 (DFF2_CLK), and is the delayed, logical inverse of the input square-wave 134. During cycles 501-503, COMP_OUT is low upon rising edges 503, 504 and 505 of DFF2_CLK, and thus, Pulse_Lag from the Q output of DFF2 is logic low, as shown at 510.

Once the phase lag occurs, COMP_OUT will be a logic high when rising edge 512 occurs. As a result, Pulse_Lag is asserted high by DFF2. Pulse_Lag being high causes the latch 312 to be reset thereby forcing D_INC low as shown at 530 (D_INC may have previously been high from a previously detected phase lead condition). The rising edge 521 of Pulse_Lag causes the counter 314 to change its count value (control word 315), this time decrementing the control word 315 due to D_INC being low. The decremented control word 315 causes PR1 and PR2 to implement a smaller resistance, thereby increasing the center frequency of bandpass filter 302. Pulses on Pulse_Lag continue, such as that shown at 522 and 524, until the phase lag condition is no longer detected, at which D_INC remains low but counter 314 is no longer clocked, and thus the control word 315 is no longer decremented.

Figure 6:
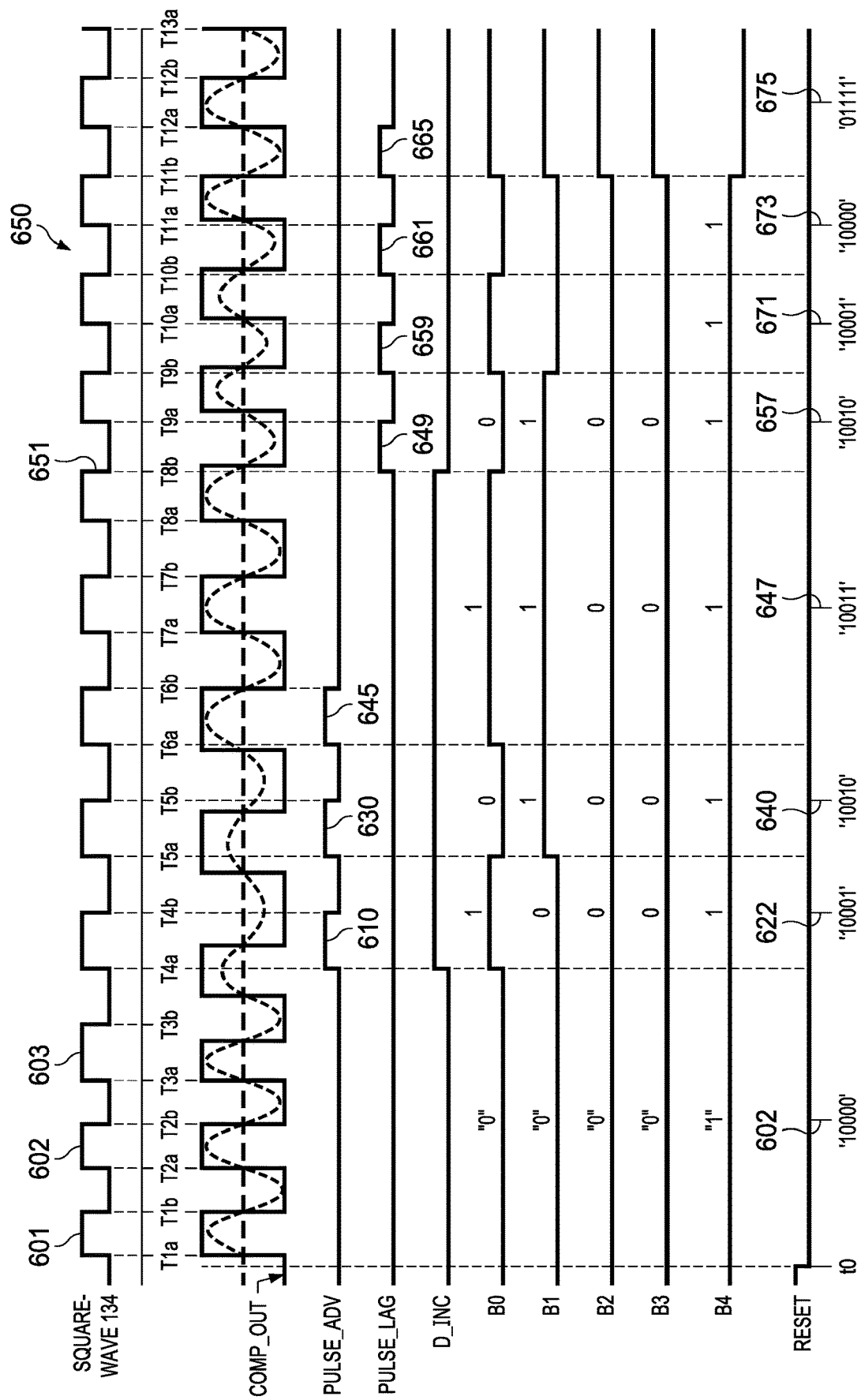
FIG. 6 is a timing diagram illustrating incrementing and decrementing the control word produced within the square wave-to-sine wave converter to adjust the resistance (and thus the center frequency) of a bandpass filter.

The counter's output count value (control word 315) is initialized to a value that causes PR1 and PR2 to be configured for a mid-resistance value (i.e., approximately half-way between the lowest configurable resistance value possible and the highest configurable resistance value possible). The counter 314 is an n-bit binary counter, where n is greater than 1. In one example, n is 5 and thus the counter is a 5-bit binary counter. The control word 315 (output count value from the counter 314) is initialized to a value of B<4:0>='10000' as shown in FIG. 6 at 602. FIG. 6 illustrates the bi-directional counter control of the self-tracking circuit 304. The comparator hysteresis and time-delay of TD1 and TD2 have been omitted for simplicity.

At t0, reset transitions from low to high, and the control word is reset to '10000' which corresponds to the middle point of the range of configurable resistance of PR1 and PR2. For input square pulses at 601-603, the frequency of the output sine-wave 123 matches the frequency of the input square-wave 134, and thus, neither Pulse_Adv nor Pulse_Lag is generated. From time T3b to T8a, the pulse width of the input square-wave increases (corresponding to a lower square-wave 134 frequency) meaning that COMP_OUT is in phase advance with respect to the input square-wave 134. As the result, at input pulse rising edge T4a, the logic high of COMP_OUT is latched by DFF1, and a Pulse_Adv pulse is generated at 610. D_INC is set to a 1, and the counter 314 increments its control word 315 from '10000' to '10001' (shown at 622). The resistance of PR1 and PR2 is increased by one step, which moves the center frequency one step lower.

At T5a, the phase of COMP_OUT still leads the phase of square-wave 134, but less so because of the previous adjustment to PR1 and PR2. Another Pulse_Adv pulse 630 pulse is generated and the control again increments from '10001' to '10010' (shown at 640), which causes an additional increases in the resistance implemented by PR1 and PR2. At T6a, the phase lead is even less, but still present. Another Pulse_Adv pulse 645 is thus generated and the control word is incremented once again to '10011' as shown at 647. At that point, phase lead is no longer detected, and the control word is maintained at '10011' during square-wave cycles 650.

At falling edge 651, however, a phase lag is now detected, and a Pulse_Lag pulse 649 is generated, thereby causing the control word to be decremented to '10010' at 657. Additional Pulse_Lag pulses 659, 661, ad 665 are generated as well to decrement the control word from '10010' to '10001' (671) to '10000' (673) to '01111' (675), at which point there is no phase lead nor phase lag, and the control word is maintained at '01111' (as well as the resistance of PR1 and PR2) until such time that phase lead or phase lag is again detected.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   a bandpass filter having a bandpass input coupled to a square wave input and a bandpass output configured to provide a sine wave signal, the bandpass filter including a first binary-weighted programmable resistor array; and
   a self-tracking circuit including:
      a comparator having a first input coupled to the bandpass output, a second input coupled to a reference signal, and a comparator output;
      a phase detector including:
         a first data flip-flop having a first clock input, a first data input coupled to the comparator output, and a first data output;
         a second data flip-flop having a second clock input, a second data input coupled to the comparator output, and a second data output;
         a first time delay element having an input coupled to the square wave input, and having an output coupled to the first clock input; and
         a second time delay element having an input coupled to the square wave input, and having an output coupled to the second clock input;

wherein the phase detector detects whether a phase of the comparator output leads or lags a phase of the input square wave, and produces a control signal of a first state responsive to the phase of the comparator output leading the phase of the input square wave, and produces the control signal of a second state responsive to the phase of the comparator output lagging the phase of the input square wave.

2. The circuit of claim 1, wherein the first binary-weighted programmable resistor array comprises a first unit resistance (R), a second resistance that has a resistance twice that of R, a first switch coupled to the first unit resistance, and a second switch coupled to the second resistance.

3. The circuit of claim 1, wherein the bandpass filter includes a second binary-weighted programmable resistor array.

4. The circuit of claim 1, wherein a frequency response of the bandpass filter has a center frequency that is based on a resistance of the first binary-weighted programmable resistor array.

5. The circuit of claim 4, wherein the counter of the self-tracking circuit generates a count value that adjusts the resistance of the first binary-weighted programmable resistor array.

* * * * *